United States Patent
Matsuzaki

(10) Patent No.: US 6,476,653 B1
(45) Date of Patent: Nov. 5, 2002

(54) DLL CIRCUIT ADJUSTABLE WITH EXTERNAL LOAD

(75) Inventor: Yasurou Matsuzaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/774,172

(22) PCT Filed: Aug. 4, 1999

(86) PCT No.: PCT/JP99/04247

§ 371 (c)(1),
(2), (4) Date: Jan. 29, 2001

(87) PCT Pub. No.: WO00/10252

PCT Pub. Date: Feb. 24, 2000

(30) Foreign Application Priority Data

Aug. 14, 1998 (JP) .......................... 10-229657

(51) Int. Cl.[7] ................................ H03L 7/06
(52) U.S. Cl. ................... 327/158; 327/161; 331/1 A
(58) Field of Search .................. 327/147, 149, 327/156, 158, 161, 276; 331/17, 25, 56, 1 A; 375/376

(56) References Cited

U.S. PATENT DOCUMENTS 5,642,082 A * 6/1997 Jefferson .................. 327/158
5,822,255 A   10/1998 Uchida ..................... 365/194
5,939,913 A *  8/1999 Tomita ..................... 327/158
5,973,525 A * 10/1999 Fujii ....................... 327/158
5,990,715 A * 11/1999 Nishimura ................. 327/158
6,194,932 B1 *  2/2001 Takemae et al. ............ 327/158

FOREIGN PATENT DOCUMENTS

| JP | A-10-55668  | 2/1998  |
| JP | A-10-171774 | 6/1998  |
| JP | A-10-320976 | 12/1998 |

* cited by examiner

Primary Examiner—Timothy P. Callahan
Assistant Examiner—An T. Luu
(74) Attorney, Agent, or Firm—Arent Fox Kintner Plotkin & Kahn

(57) ABSTRACT

The present invention provides a DLL circuit performing a phase adjustment in accordance to an output load, and capable of adjusting the phase in a shot time. In the present invention, in a delayed lock loop (DLL) circuit that generates a control clock having a prescribed phase relationship with a reference clock by delaying the reference clock, the operating delay time of an output buffer is measured and the timing of the control clock is adjusted in accordance with this operating delay time. As a result, the timing of the output clock of the first variable delay circuit delay circuit is adjusted in accordance with the magnitude of the external load. This output clock or the output clock of a separate variable delay circuit subject to the same delay control is then utilized as a control clock.

9 Claims, 18 Drawing Sheets

Clock CLK2 passes N33 of Variable Delay Circuit 20

DLL CIRCUIT ADJUSTABLE WITH EXTERNAL LOAD

BACKGROUND OF THE INVENTION

1. Field of the Invention

The present invention relates to a delayed lock loop (DLL), which is a circuit whereby the timing of a clock is stabilized, and, in particular, relates to a DLL circuit wherein the timing of the control clock can be adjusted according to an external load connected to an output terminal in a short time.

2. Description of the Related Art

High-speed memory devices constituted by SDRAMs that operate in synchronism with an external clock are widely used. Such clock-synchronized memory devices incorporate therein a timing control circuit consisting of a delayed lock loop (DLL) circuit in order to input and output data synchronously with an external clock. Such a DLL circuit is disclosed for example in Laid-open Japanese Patent Publication No. H10-112182 applied for by the present applicant.

The DLL circuit referred to above generates a control clock whose phase is coincident with or in a prescribed phase relationship with the supplied external clock, and this control clock controls the operating timing of the input buffer and/or output buffer. In general terms, the DLL circuit comprises a variable delay circuit that delays a reference clock, a dummy delay circuit that further delays the clock of the output of this variable delay circuit by the amount of the delay time of the input buffer and/or output buffer, and a phase comparator and delay control circuit that compare the phases of the reference clock and the delayed clock of the output of the dummy delay circuit and thereby control the amount of delay of the variable delay circuit such that the phases of the two clocks agree. In the locked condition in which the phases of the reference clock and delayed clock coincide, the data output that is output from the data output buffer in response to the control clock of the output of the variable delay circuit coincides with the phase of the external clock.

Memory devices or other devices incorporating a DLL circuit as described above are usually mounted on a printed circuit board or a module circuit board. The output terminal of the data output buffer whose operating timing is controlled by the control clock generated by the DLL circuit is connected to wiring such as of the printed circuit board where it is mounted. Consequently, the time required for operation of the data output buffer is different depending on the magnitude of this external load.

However, the external load that is connected to the output terminal of such a data output buffer depends on the construction of the wiring of the printed circuit board or module circuit board where it is mounted and cannot be predicted at the stage of design of the device itself. It may therefore be considered that if the delay time of the dummy output buffer provided in the feedback loop of the DLL circuit is made fixed, the delay time required for operation of the data output buffer in the condition in which the device is installed in the system will not match the fixed set operating time of the dummy output buffer. As a result, the timing of the control clock produced by the DLL circuit becomes non-optimal.

When the device is installed in the system, for example in the initialization condition after actuation of the power source, it is therefore desired to set the amount of delay of the delay circuit in the feedback loop taking into account external load.

On the other hand, since the device outputs are connected to a bus that is common to a plurality of devices, it is not possible to adjust each of a plurality of devices simultaneously in the initialization condition; rather, adjustment must be carried out for each of the devices, one by one. In this situation, it is demanded to be able to adjust the delay amounts in the feedback loop for each individual device. However, with the DLL circuit proposed in the above Laid-open Japanese Patent Publication No. H10-112182, in order to adjust the timing, it is necessary to perform a phase comparison operation of the reference clock and the delayed clock a plurality of times, as well as adjustment of the amount of delay. If adjustment in accordance to the external load is performed for each device, a long time is required for timing adjustment of the system as a whole.

An object of the present invention is therefore to provide a DLL circuit capable of generating a control clock which is synchronized with a reference clock and which has optimum timing adapted to an external load connected to the output terminal of the device.

A further object of the present invention is to provide a DLL circuit capable of generating a control clock which is synchronized with a reference clock and which has optimum timing adapted to an external load connected to the output terminal of the device, in which adjustment to the optimum timing can be achieved in a short time.

SUMMARY OF THE INVENTION

In order to achieve the above object, in a first aspect of the present invention, in a delayed lock loop (DLL) circuit that generates a control clock having a prescribed phase relationship with a reference clock by delaying the reference clock, the operating delay time of an output buffer is measured and the timing of the control clock is adjusted in accordance with this operating delay time. The DLL circuit comprises: a first variable delay circuit that receives the reference clock and outputs a clock delayed by a controlled delay time; a second variable delay circuit that receives the output clock of the first variable delay circuit and outputs a delayed clock delayed by a prescribed delay time; and a phase comparison/delay control circuit that compares the phase of the reference clock and the delayed clock and controls the amount of delay of the first variable delay circuit such that the phase of the reference clock and of the delayed clock are in coincidence. Also, the operating delay time of said output buffer, which is different depending on an external load, is measured, and the delay amount of the second variable delay circuit in the feedback loop of the DLL circuit is adjusted in accordance with the measured operating delay time of the output buffer. As a result, the timing of the output clock of the first variable delay circuit delay circuit is adjusted in accordance with the magnitude of the external load. This output clock or the output clock of a separate variable delay circuit subject to the same delay control is then utilized as a control clock.

In order to achieve the above object, in another aspect of the present invention, in a delayed lock loop (DLL) circuit that generates a control clock having a prescribed phase relationship with a reference clock by delaying the reference clock, wherein an output buffer supplies an output signal to an output terminal in response to the control clock, the DLL circuit comprises: a first variable delay circuit that receives the reference clock and outputs a clock delayed by a controlled delay time; a second variable delay circuit that receives the output clock of the first variable delay circuit and outputs a delayed clock delayed by a prescribed delay time; a phase comparison/delay control circuit that compares the phase of the reference clock and the delayed clock and controls the amount of delay of the first variable delay circuit such that the phase of the reference clock and of the delayed clock are in a prescribed relationship; and a delay measurement circuit that measures an operating delay time of the output buffer and sets the delay amount of the second variable delay circuit in accordance with the measured operating delay time.

With the above construction, the timing of the control clock can be finely adjusted in accordance with the output load of the output terminal, so that a control clock of optimum timing can be generated.

Furthermore, in a preferred embodiment of the present invention, in the above invention, the delay measurement circuit measures the time from the timing of the control clock to the timing of the output signal of the output buffer. Since the operating delay time of the output buffer is measured and the amount of delay of the second variable delay circuit is set in accordance therewith, setting can be achieved in a shorter time than setting of the delay amount using the feedback loop of the DLL circuit.

DESCRIPTION OF THE PREFERRED EMBODIMENTS

Embodiments of the present invention are described below with reference to the drawings. However, the scope of the present invention is not restricted to these embodiments.

[DLL circuit]

Figure 1:
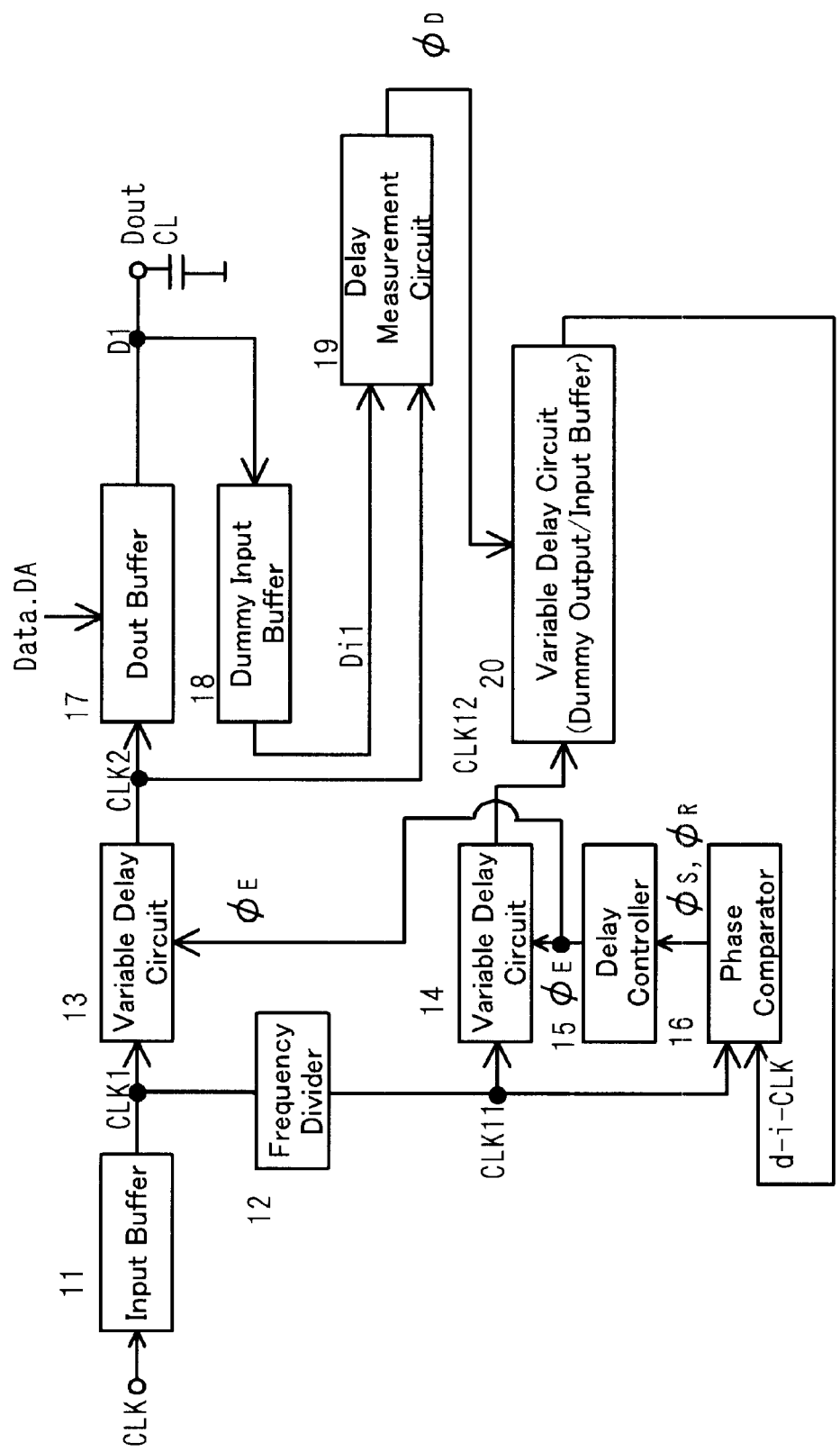
FIG. 1 is a layout diagram of a DLL circuit according to a first embodiment.
Figure 2:
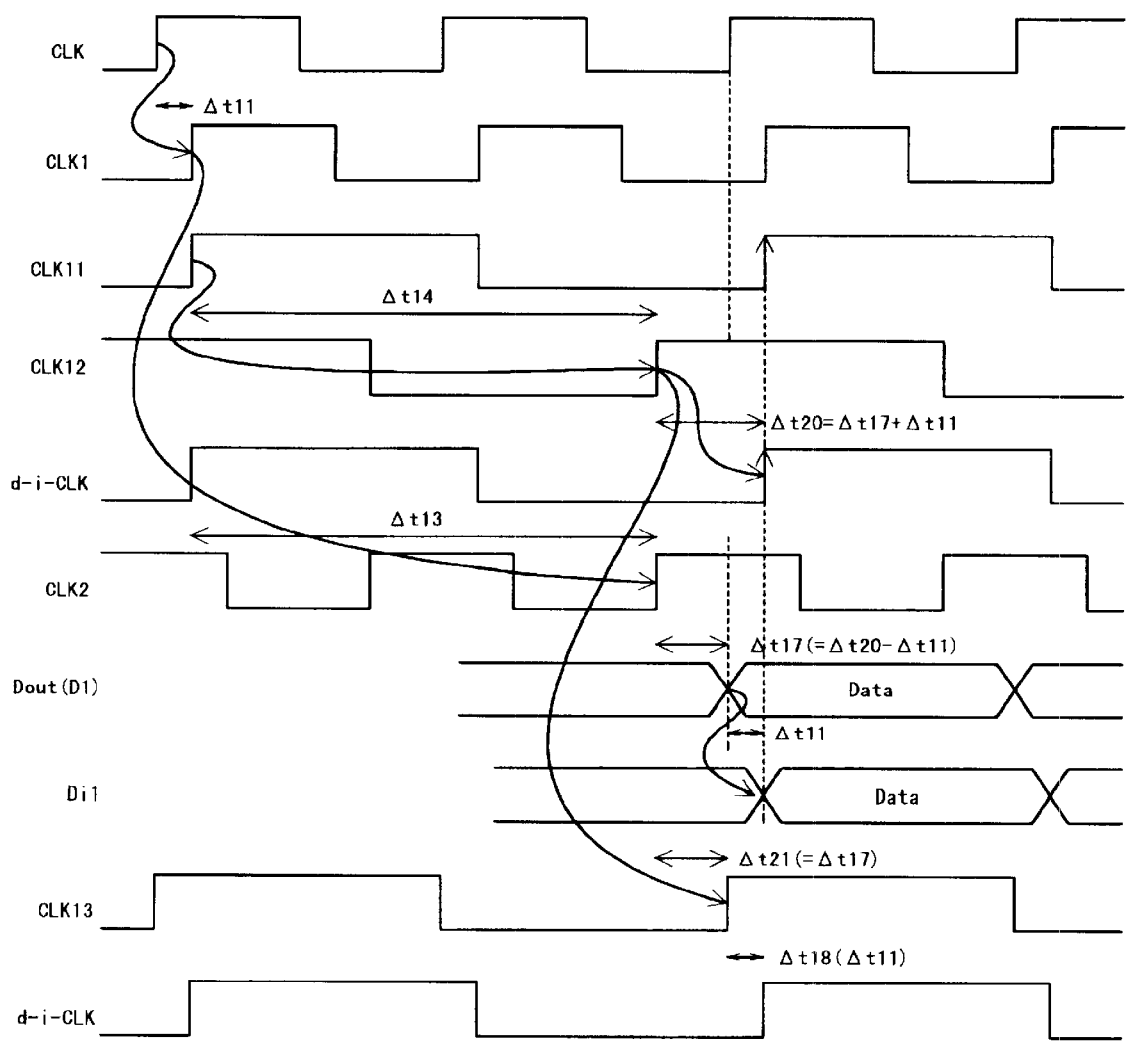
FIG. 2 is an operation timing chart of the DLL circuit.

FIG. 1 is a layout diagram of a DLL circuit according to a first embodiment. Also, FIG. 2 is an operation timing chart thereof. An external clock CLK from outside is supplied to input buffer 11 where a reference clock CLK1 is generated. In FIG. 2, the delay time $\Delta t11$ of the input buffer 11 is shown; as shown, the reference clock CLK1 is shifted in phase by a delay time $\Delta t11$ from the external clock CLK.

Reference clock CLK1 is delayed by delay time $\Delta t13$ controlled by variable delay circuit 13 and becomes control clock CLK2. Control clock CLK2 is supplied to data output buffer 17. Data output buffer 17 gets data DA in response to control clock CLK2 and supplies output D1 to output terminal Dout. External load $C_L$ such as the printed circuit board on which the device is mounted is connected to output terminal Dout. Consequently, data output buffer 17 must drive output terminal $D_{out}$ and external load $C_L$. That is, the operating time $\Delta t17$ of data output buffer 17 will be different depending on the magnitude of the external load $C_L$.

Reference clock CLK1 is divided in frequency by frequency divider 12 to for example one half of its frequency. The frequency-divided reference clock CLK11 is delayed by a delay time $\Delta t14$ controlled by a separate variable delay circuit 14, to provide a clock CLK12. This variable delay circuit 14 is a delay circuit identical to the variable delay circuit 13, and is controlled so as to have an identical delay time by means of delay control signal $\phi_E$. Clock CLK12 is supplied to a further variable delay circuit 20 that is provided in the feedback loop, so that a delayed clock d-i-clk that has been delayed by a time corresponding to the operating delay time ($\Delta t20=\Delta t11+\Delta t17$) of input buffer 11 and output buffer 17 is output.

Phase comparison circuit 16 compares the phase of reference clock CLK11 with the delayed clock d-i-clk, to generate phase comparison result signals $\phi_S$ and $\phi_R$, which are supplied to delay control circuit 15. Delay control circuit 15 generates a delay control signal $\phi_E$ that controls the amount of delay of variable delay circuits 14, 13 in accordance with the phase comparison result signals $\phi_S$ and $\phi_R$ such that the phase difference between the two clocks CLK11 and c-i-clk is eliminated. As a result, the total ($\Delta t14+\Delta t20$) of the amounts of delay of variable delay circuit 14 and variable delay circuit 20 is controlled such that it becomes the period of reference clock CLK11 (or an integral multiple of the clock CLK). As a result, the phase of the reference clock s CLK11 and the delayed clock c-i-clk coincide.

In the embodiment of FIG. 1, the delay amount $\Delta t20$ of the variable delay circuit 20 in the feedback loop in the DLL circuit is set in accordance with the operating delay time $\Delta t17$ of the data output buffer 17, which differs depending on the output load $C_L$. Specifically, delay measurement circuit 19 measures the total of the time $\Delta t17$ from the rising edge of control clock CLK2 that controls the start of operation of data output buffer 17 to the timing until the output signal D1 changes in response to this control clock CLK2 and the time $\Delta t11$ taken for this output signal D1 to pass through dummy input buffer 18. The delay amount of variable delay circuit 20 is then set by delay setting signal $\phi_D$ in accordance with this measured time ($\Delta t17+\Delta t11$). Consequently, variable delay circuit 20 is set to the total time of operating delay time $\Delta t17$ of data output buffer 17 and delay time $\Delta t11$ of dummy input buffer 18. Since the delay time $\Delta t11$ of input buffer 11 does not depend on the external load $C_L$ of output terminal $D_{out}$, dummy input buffer 18 having a delay time identical therewith is utilized.

As will be described hereinbelow, delay measurement circuit 19 can measure the operating delay time Δt17 of data output buffer 17 in a single data output operation. Although not essential, a frequency divider 12 is provided in order to lower the frequency with which the phase comparison operation and delay control operation of the DLL circuit are performed with respect to the high-frequency clock CLK. In cases where there is no need to lower the frequency with which these operations are performed, as in the example described below, this frequency divider 12 is unnecessary. In this case, variable delay circuits 13, 14 can be constituted by a single variable delay circuit.

In the construction described above, the delay time of variable delay circuit 20 in the feedback loop of the DLL circuit is set in accordance with the operating delay time of the data output buffer 17, which changes depending on the external load $C_L$. Consequently, since the phases of the reference clock CLK11 and the delayed clock c-i-clk coincide, the timing of the rising edge of control clock CLK2 is in advance of the rising edge (phase 0°) of the external clock CLK by the amount of the operating delay time Δt17 of data output buffer 17, so the output signal D1 that is output is output in coincidence with the phase of the rising edge of external clock CLK.

Figure 3:
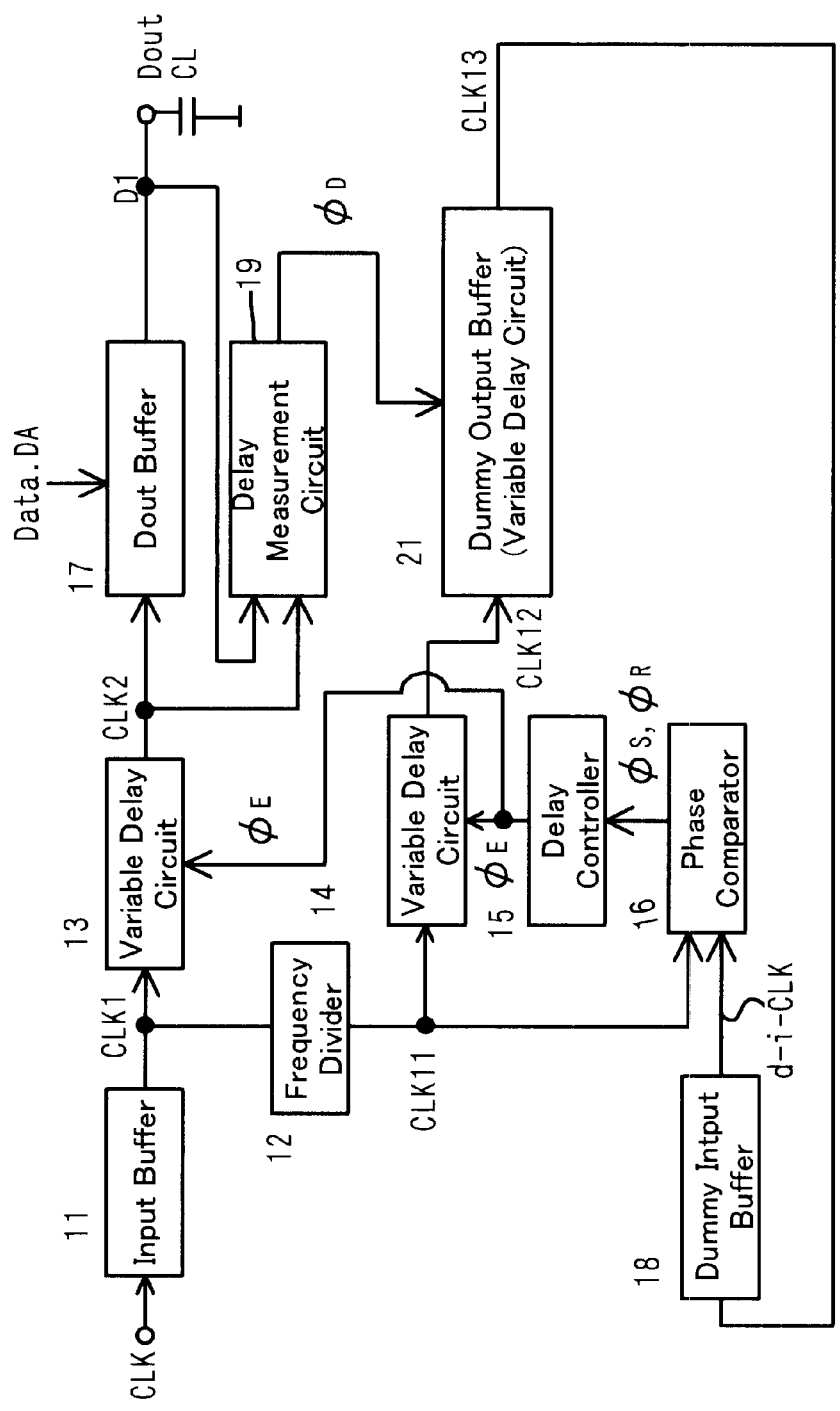
FIG. 3 is a layout diagram of a DLL circuit according to a second embodiment.

FIG. 3 is a layout diagram of a DLL circuit according to a second embodiment. Its operation timing chart is shown in FIG. 2. In the DLL circuit of FIG. 3, parts which are the same as in FIG. 1 have the same reference numerals. In the second embodiment, in contrast to the first embodiment, a dummy output buffer 21 constituted by a variable delay circuit and a dummy input buffer 18 of fixed delay amount are provided in the feedback loop of the DLL circuit. Delay measurement circuit 19 measures the time Δt17 from the rising edge of control clock CLK2 until data output buffer 17 outputs output signal D1, and sets the delay time of dummy output buffer 21 in accordance with this delay time Δt17 by means of delay amount setting signal $\phi_D$. Consequently, the delayed clock CLK13 is delayed by the measured time Δt17 from clock CLK12. Clock CLK13 is then further delayed by a delay time Δt18 (=Δt11) identical with the input buffer 11 by dummy input buffer 18, thereby providing a delayed clock c-i-clk. The rest of the layout is the same as in the case of the circuit of FIG. 1.

Figure 4:
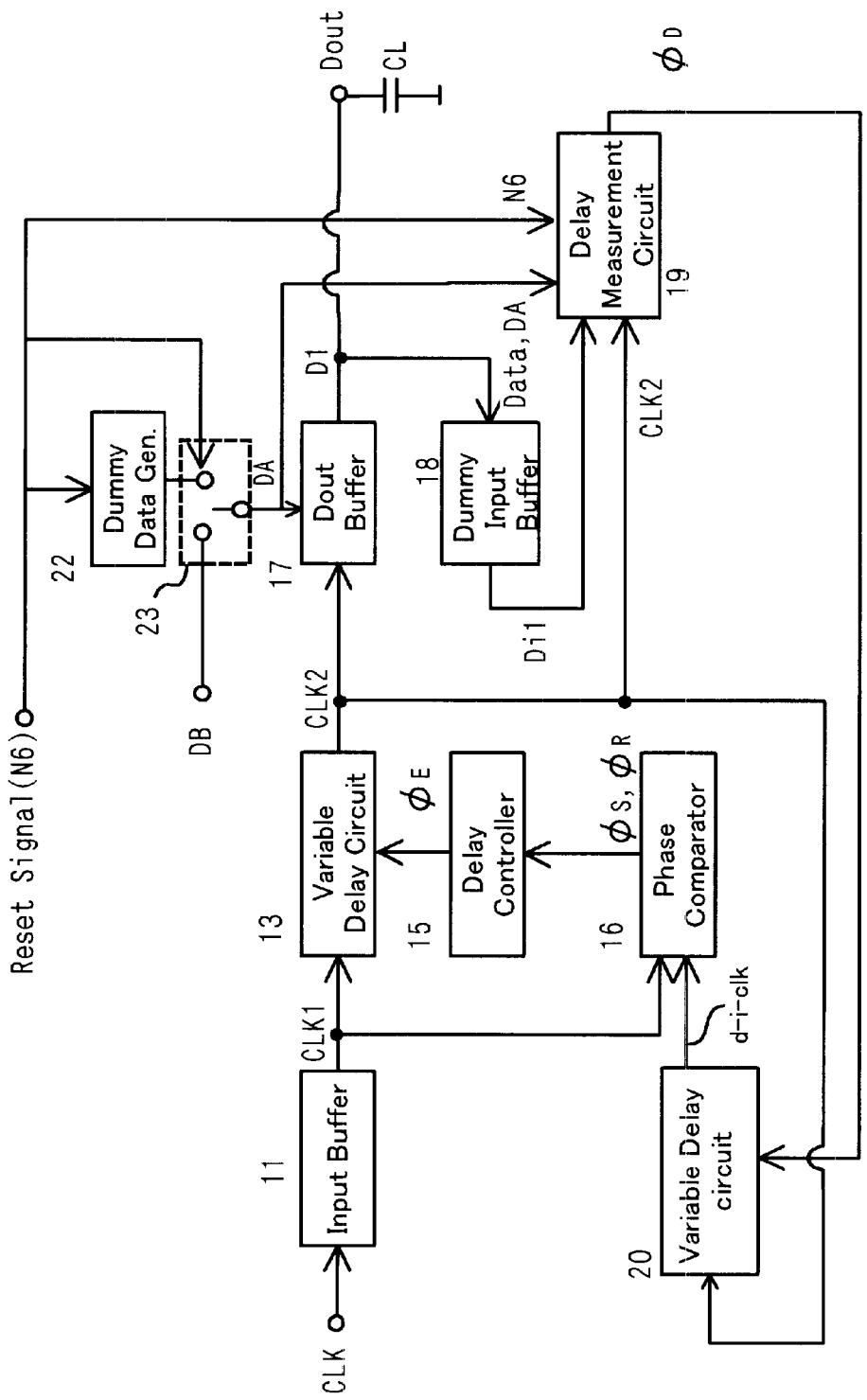
FIG. 4 is a layout diagram of a modified example of a DLL circuit according to the first embodiment.

FIG. 4 is a layout diagram of a DLL circuit according to a modified example of the first embodiment. In this example, the variable delay circuits 13, 14 of FIG. 1 are constituted by a common variable delay circuit 13, and no frequency divider 12 is provided. Consequently, the clock CLK2 of the output of variable delay circuit 13 is supplied through variable delay circuit 20 to phase comparison circuit 16, and this clock CLK2 is shared as a control clock with data output buffer 18. Phase comparison circuit 16 performs a phase comparison at intervals of the period of the external clock CLK, and delay control circuit 15 controls the amount of delay of variable delay circuit 13. Just as in the case of the first embodiment of FIG. 1, delay measurement circuit 19 measures the total of the time Δt17 from the rising edge of control clock CLK2 until data output buffer 17 outputs output signal D1 and the delay time Δt11 of dummy input buffer 18.

In the embodiment of FIG. 4, the data DA supplied to data output buffer 17 is changed by a switch 23 between ordinary data from a data bus DB in the memory device or dummy data from a dummy data generator 22, which is activated in the initialization condition on power source start-up. In the initialization condition on power source start-up, the memory device is not operating, so there is no change in the ordinary output data from the data bus. A dummy data generator 22 is therefore activated in response to a reset signal generated in the initialization condition and the dummy data is supplied to data output buffer 17 and utilized for the measurement operation performed by delay measurement circuit 19.

Also, in the initialization condition, in response to the reset signal N6, delay measurement circuit 19 measures the time from the rising edge of the control clock CLK2 until the output Di1 of dummy input buffer 18 changes. In order to achieve this, delay measurement circuit 19 measures the time from the rising edge of the subsequent control clock CLK2 until the falling edge of output signal Di1 after detecting the change of the data DA supplied to data output buffer 17 for example from H level to L level.

Furthermore, as will become clear from the internal circuitry of delay measurement circuit 19, to be described, even in the normal operation condition, delay measurement circuit 19 measures the time from the rising edge of the subsequent control clock CLK2 until the falling edge of output signal Di1 after detecting the change of the data DA supplied to data bus DB from H level to L level with a prescribed frequency. The amount of delay of variable delay circuit 20 which was first set in the initialization condition may change as a result of change of the external load $C_L$ due for example to changes of temperature or other factors. In such cases, the amount of delay of variable delay circuit 20 is reset by operation of delay measurement circuit 19 in the ordinary operating condition.

[Delay Measurement Circuit]

Figure 5:
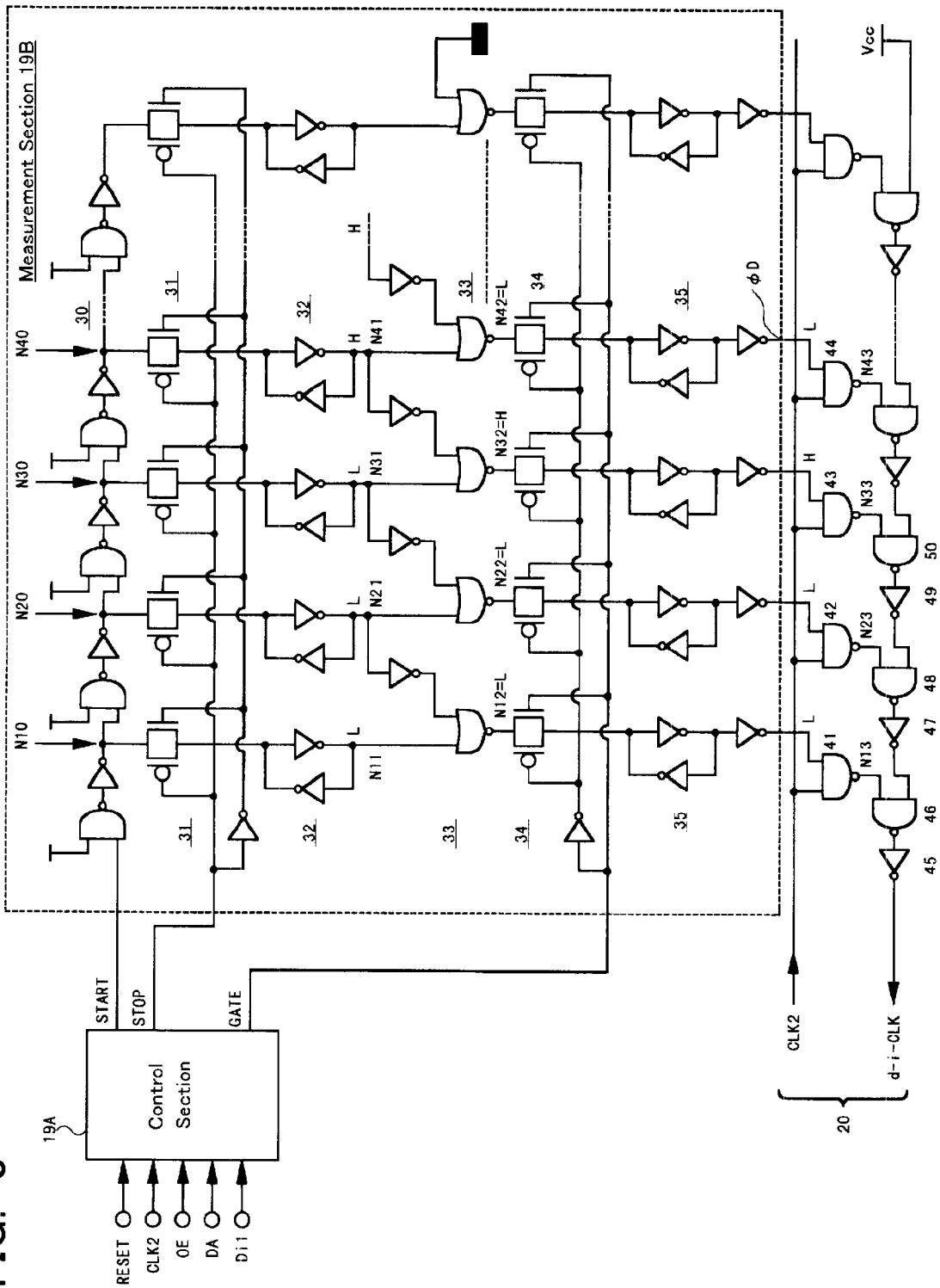
FIG. 5 is a view showing the layout of a delay measurement circuit 19 and variable delay circuit 20.

FIG. 5 is a view showing the layout of delay measurement circuit 19 and variable delay circuit 20. The layout of the variable delay circuit 21 shown in FIG. 1 is also identical.

Delay measurement circuit 19 comprises a control section 19A of the delay measurement circuit, and a measurement section 19B that measures the delay time, being controlled by a start pulse START, a stop pulse STOP and a gate pulse GATE generated by this control section 19A. The layout of control section 19A will be described later. Also, measurement section 19B generates a delay setting signal $\phi_D$ in accordance with the measurement results and the amount of delay of variable delay circuit 20 is set by this delay setting signal $\phi_D$.

As will be described, in the initialization condition on power source start-up, the control section 19A of the delay measurement circuit 19, in response to reset signal RESET, detects changeover of data DA from H level to L level and generates a start pulse START in response to the rising edge of the immediately following control clock CLK2. The H level produced by the rise of the start pulse START is propagated through delay circuit 30 comprising NAND gates and inverters. Each of the nodes N10 to N40 of delay circuit 30 therefore successively become H level. This condition is latched through gates 31 by a group of latch circuits 32 comprising inverters.

Figure 6:
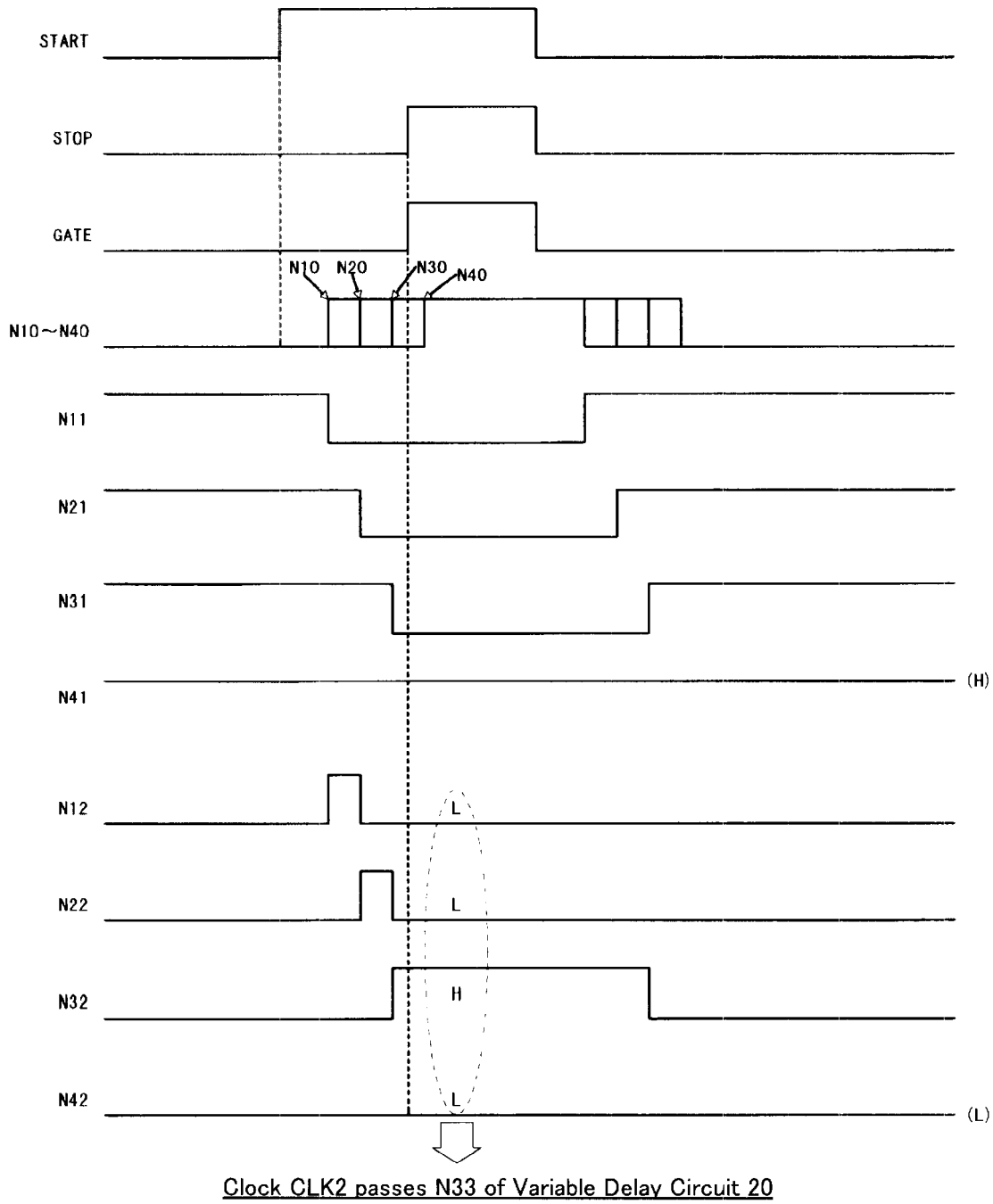
FIG. 6 is an operation timing chart of the delay measurement circuit.

Control section 19A generates a stop pulse STOP in response to the falling edge of output signal Di1 of dummy input buffer 18, and CMOS transfer gates 31 are closed by this stop pulse signal STOP. Specifically, at the time point where stop pulse STOP is generated, the nodes N10 to N40 up to the location to which the start pulse START has propagated through the delay circuit 30 have become H level. In the example timing chart of FIG. 6, changeover to H level has taken place as far as mode N30. Consequently, by generation of the stop pulse STOP, the nodes N11, N21 and N31 of latch circuit group 32 become L level and node N41 etc on the right hand side of them become H level.

Consequently, of the outputs of NOR gate group 33, only node N32 becomes H level; all the other nodes N12, N 22 and N 42 are L level.

Control section 19A generates a gate pulse GATE in response to generation of stop pulse STOP. In response to the H level of this gate pulse GATE, the CMOS transfer gate group 34 become conductive, with the result that the latch circuit group 35 latches the aforesaid condition. Consequently, of the delay setting signals $\phi_D$, only the third-stage signal becomes H level; all the rest become L level.

Variable delay circuit 20 is constituted by a delay circuit comprising inverters 45, 47, 49 etc and NAND gates 46, 48, 50 etc, together with NAND gates 41, 42, 43, and 44 that are supplied with control clock CLK2 that is input. Control clock CLK2 is supplied to one input of these NAND gates 41 to 44, while their other input is supplied with delay setting signal $\phi_D$. In the above example, only the delay setting signal $\phi_D$ that is supplied to NAND gate 43 is H level, so the rising edge of control clock CLK2 makes node N33 L level through NAND gate 43. As a result, control clock CLK2 becomes the delayed clock c-i-clk by passing through NAND gate 43 and gates 50 to 45, so the amount of delay of variable delay circuit 20 is set to the gate delay amount of the total of 7 stages.

As described above, measurement section 19B measures the total of the delay times of data output buffer 17 and dummy input buffer 18 on a single change from H level to L level of the data output signal DA. The amount of delay of variable delay circuit 20 is then set in accordance with this measured result. Phase adjustment in accordance with the output load $C_L$ of the DLL circuit can therefore be performed in a short time.

Figure 7:
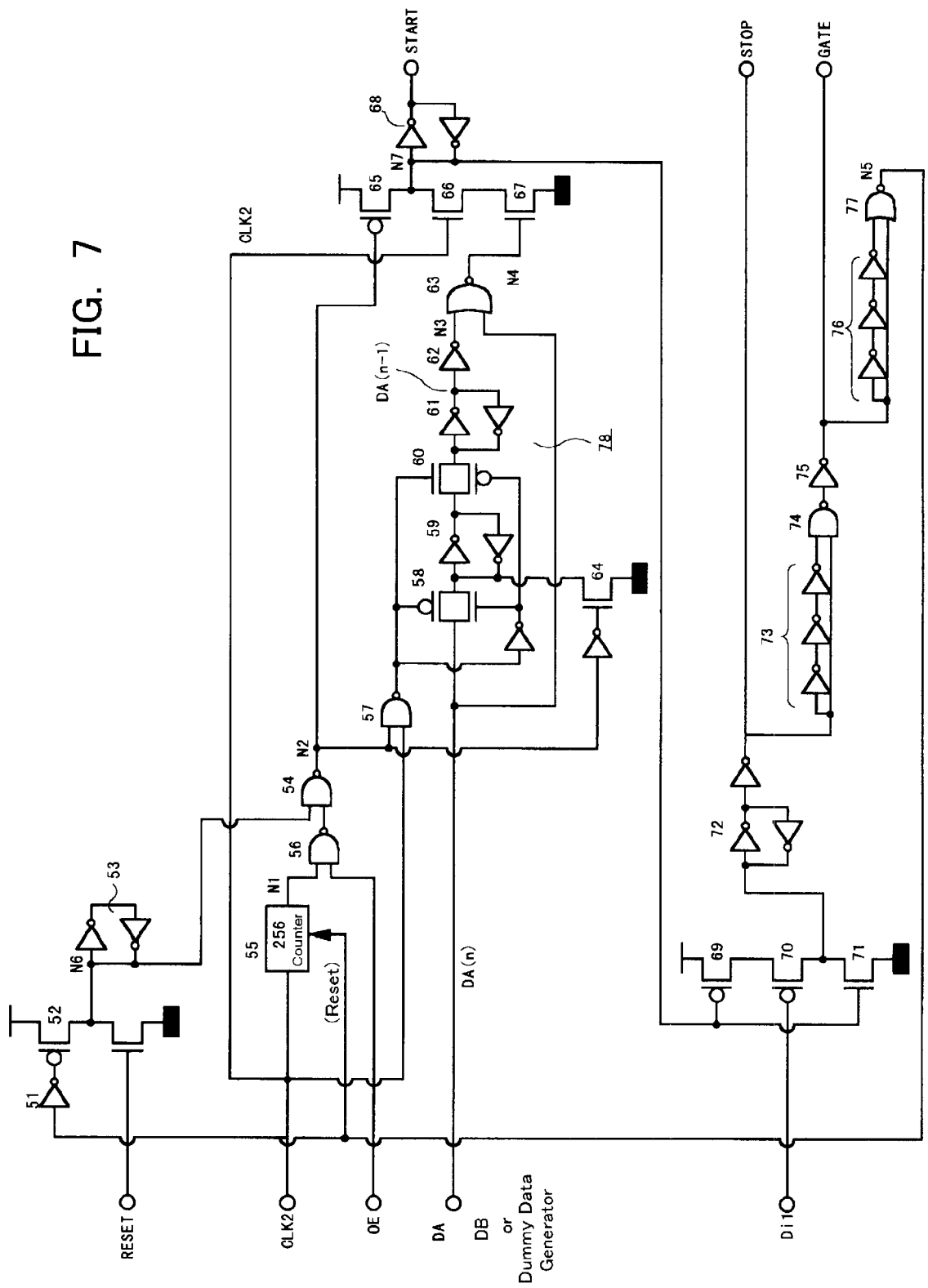
FIG. 7 is a circuit diagram of a control section of the delay measurement circuit.

FIG. 7 is a circuit diagram of the control section 19A of the delay measurement circuit. In the initialization condition, the activation signal N2 of this control section 19A becomes H level in response to H level of the reset signal RESET. Whilst the activation signal N2 is in the activated condition i.e. H level, control section 19A generates a start pulse START, stop pulse STOP and gate pulse GATE and thereafter returns on its own to the non-activated condition. Also, even in the ordinary operating condition, the activation signal N2 becomes H level at prescribed time intervals determined by counter 55.

In the activated condition, a data DA falling detection signal N4 is generated by a circuit 78 for detecting falling of data DA, and the start pulse START becomes H level in response to the rise of control clock CLK2 immediately thereafter. Furthermore, the stop pulse STOP becomes H level in response to a fall of signal Di1 after a rise of the start pulse START to H level. A gate pulse GATE is then generated in response to the rising edge of stop pulse STOP. A non-activation signal N5 is generated in response to generation of gate pulse GATE, causing latch circuit 53 to be inverted, making activation signal N2 return to L level. In response to this, the start pulse START and stop pulse STOP return to L level. From the rising edge of the start pulse START until the rising edge of stop pulse STOP therefore corresponds to the total delay time of output buffer 17 and dummy input buffer 18.

Figure 8:
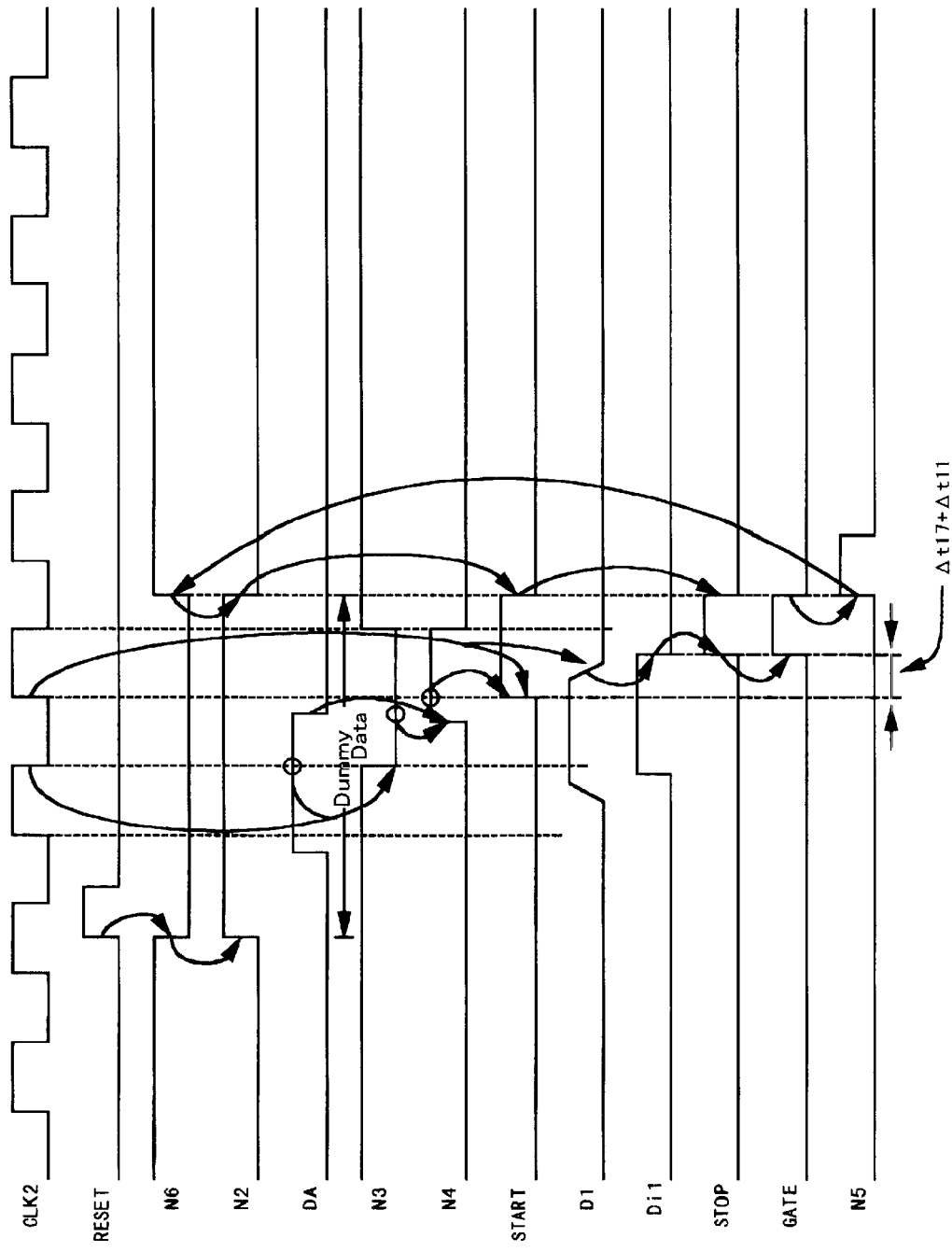
FIG. 8 is an operation timing chart of the control section of the delay measurement circuit in the initialization condition.

FIG. 8 is an operation timing chart of the control section 19A of the delay measurement circuit in the initialization condition. When, in the initialization condition such as on power source start-up, the DLL circuit enters the phase adjustment mode, a reset pulse RESET is generated and dummy data are generated from dummy data generator 22. As already explained, in this embodiment, the delay time of output buffer 17 and dummy input buffer 18 is measured utilizing the falling timing of the data signal DA. In order to achieve this, measurement is performed when the output data signal D1 is changed over from H level to L level. That is, measurement of the delay time is performed if the data DA (n−1) on the preceding occasion is H level and the current data DA (n) is L level.

Inverter 52 makes node N6 L level in response to the rising edge of the reset pulse RESET. In response to this, activation signal N2 becomes H level through NAND gate 54. As a result, NAND gate 57 is put in conductive condition, causing control clock CLK2 to be inverted and supplied to gates 58 and 60. Furthermore, data DA falling detection circuit 78 transfers this data DA to latch circuits 59, 61 by gates 58, 60 that conduct synchronously with the edge of control clock CLK2. That is, when the dummy data DA is H level at the falling edge of control clock CLK2 and L level at the fallowing rising edge of control clock CLK2, detection signal N4 becomes H level, causing N type transistor 67 to conduct.

N type transistor 66 also conducts in response to the rising edge of control clock CLK2 immediately thereafter, making node N7 L level and causing start pulse START to rise to H level. Measurement by measurement section 19B is thereby commenced.

P type transistor 69 conducts in response to he L level of this node N7. P type transistor 70 then also conducts in response to the falling edge of the subsequent output signal Di1 of dummy input buffer 18, thereby making the start pulse STOP H level. Performance of measurement by measurement section 19B is thereby terminated.

A gate pulse GATE having a pulse width of the amount of the delay time of inverters 73 is generated in response to the rising edge of stop pulse STOP. Furthermore, in response to the falling edge of a gate pulse GATE, a non-activation pulse N5 is generated having a pulse width of the amount of the delay time of inverters 76, causing signal N6 to return to H level and activation signal N2 to be made L level. In response to the falling edge to L level of this activation signal N2, start pulse START and stop pulse STOP both fall to L level.

Figure 9:
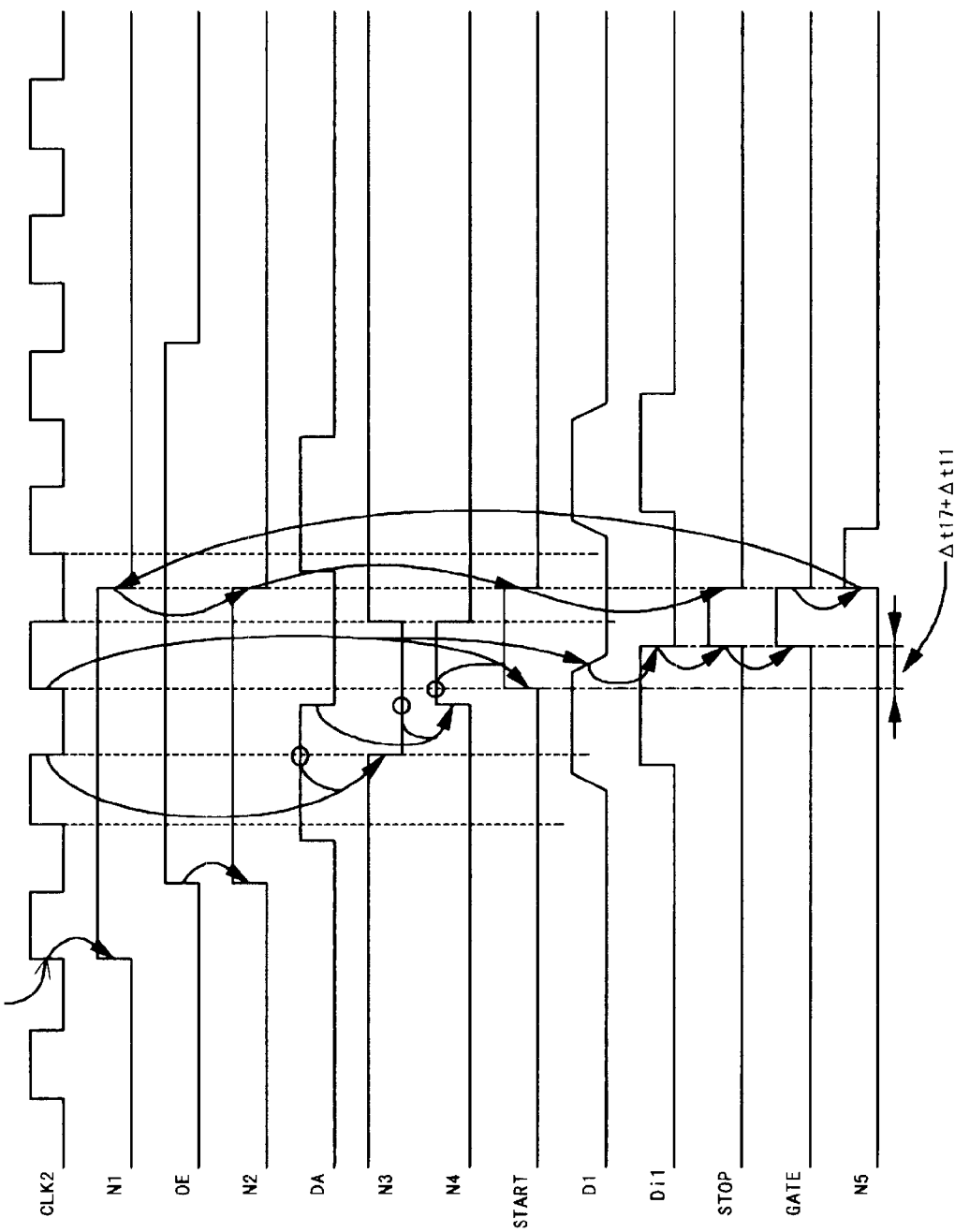
FIG. 9 is an operation timing chart of the control section of the delay measurement circuit in the normal operation condition.

FIG. 9 is an operation timing chart of the control section of the delay measurement circuit in the ordinary operation condition. In the ordinary operation condition, control clock CLK2 is generated by the DLL circuit, wherein the amount of delay of variable delay circuit 20 is adjusted in the phase adjustment mode in the initialization condition. Taking into account temperature changes etc, the counter 55 shown in FIG. 7 then counts control clock CLK2 and when for example a count of 256 is reached, signal N1 becomes H level. The output enable signal OE then becomes H level, causing read data DA from data bus DB to be supplied to data output buffer 17, whereupon activation signal N2 is made H level by the NAND gates 56 and 54.

The start pulse, stop pulse and gate pulse are generated in the same way as in the case of the initialization condition described above when the data DA of H level on a fall edge of control clock CLK2 and the data DA of L level on the next rising edge are detected, during the period while this activation signal N2 is H level. This operation is the same as the operation in phase adjustment mode in the initialization condition. Finally, counter 55 is reset at the rising edge of signal N5, and the measurement operation is thereby terminated. In this way, measurement of the delay time is performed utilizing the single falling edge of the data pulse DA.

[Dummy Data Generator]

Figure 10:
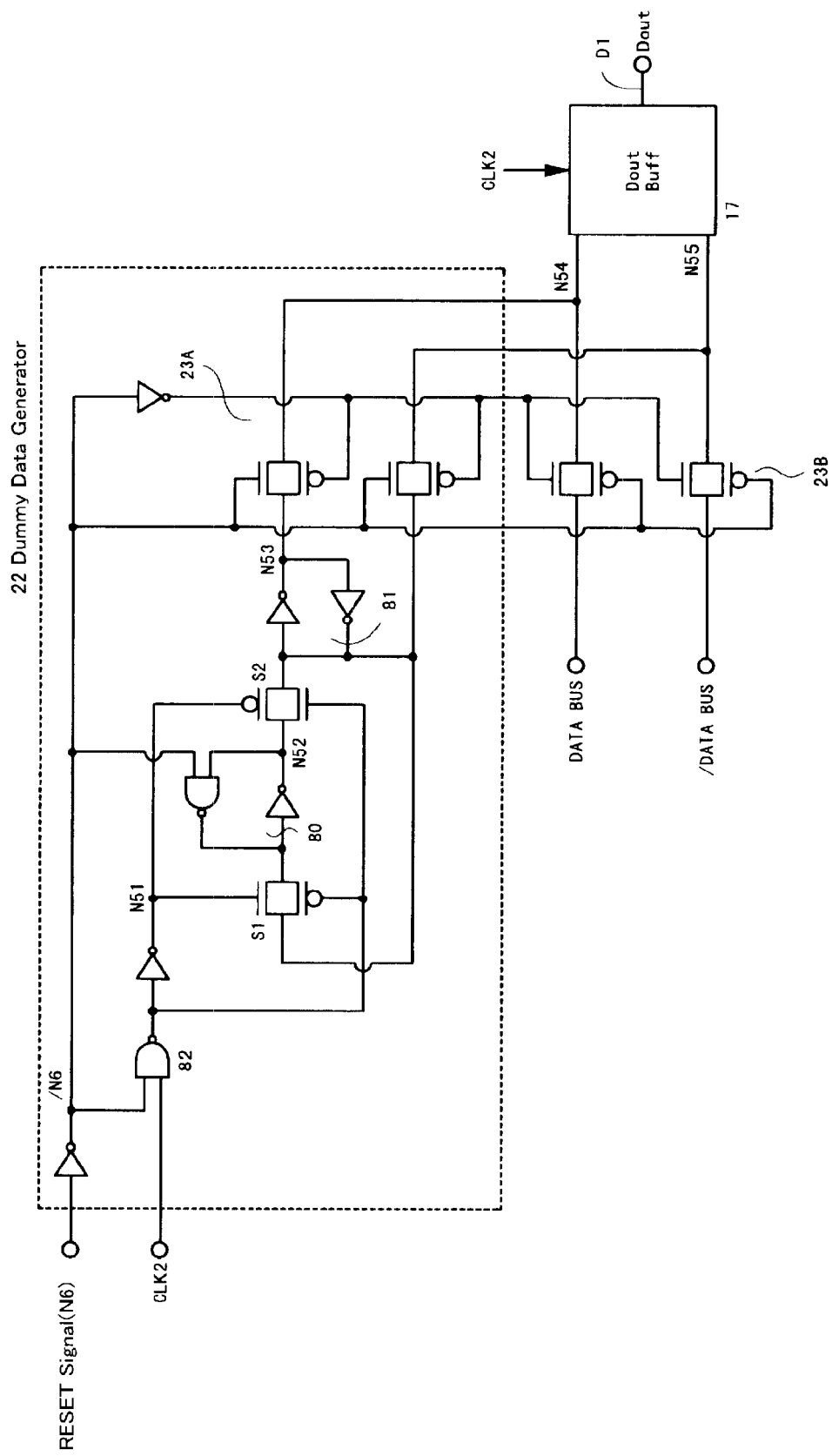
FIG. 10 is a circuit diagram of a dummy data generator.
Figure 11:
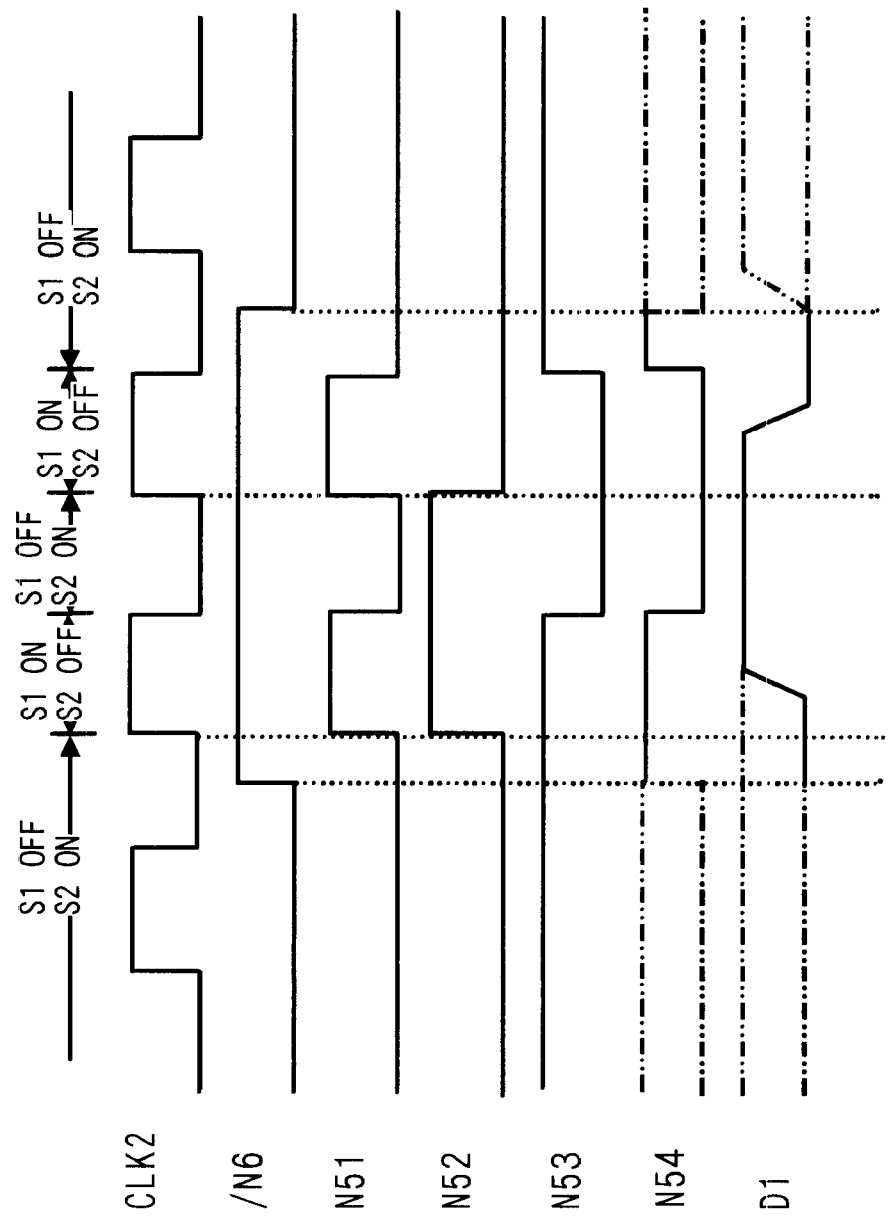
FIG. 11 is an operation timing chart of a dummy data generator.

FIG. 10 is a circuit diagram of a dummy data generator. Also, FIG. 11 is an operation timing chart thereof. The dummy data generator, in the initialization condition immediately after switching on the power source, when phase adjustment mode is executed, generates dummy data and supplies this to data output buffer 17.

At first, while the inverted signal /N6 is L level, node N52 of latch circuit 80 is L level and node N53 of latch circuit 81 is H level. Thereupon, in response to the reset pulse RESET immediately after switching on the power source, signal N6 becomes L level and the inverted signal /N6 becomes H level. As a result, NAND gate 82 is put in conductive condition. The control clock CLK2 is inverted by NAND gate 82 and is supplied to CMOS transistor gates S1, S2, turning these gates S1, S2 alternately on and off. In response to this, a clock obtained by frequency division of control clock CLK2 to one half is generated at node N52 and N53.

In the initialization condition, the inverted signal /N6 becomes H level, switch 23A conducts, and the dummy data generated by dummy data generator 22 is supplied to node N54 and N55 and is supplied to data output buffer 17. Also, in the ordinary condition, inverted signal /N6 becomes L level, switch 23B conducts, and data from the data bus are supplied to data output buffer 17.

[Data Output Buffer]

Figure 12:
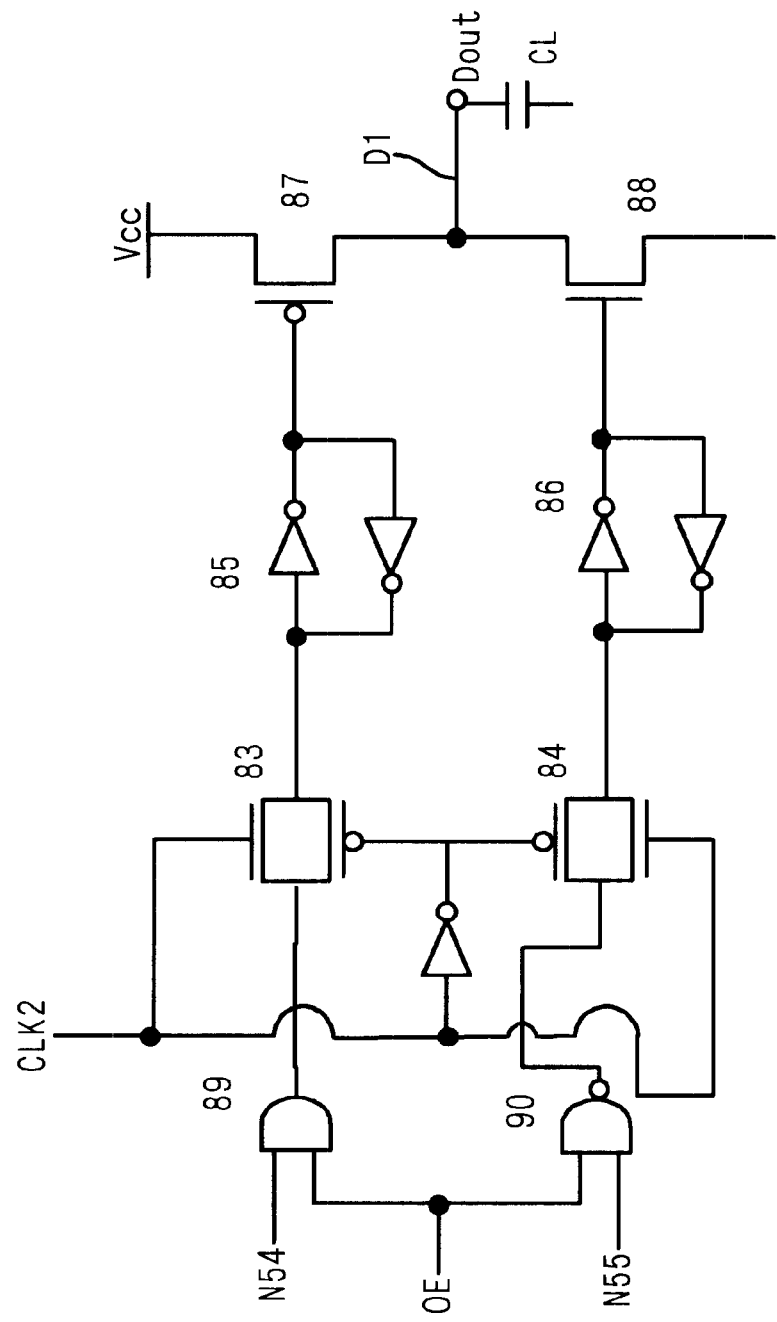
FIG. 12 is a circuit diagram of a data output buffer.

FIG. 12 is a circuit diagram of the data output buffer. The data output buffer comprises a large P type transistor 87 and N type transistor 88 that drive output terminal $D_{out}$. Data signals that are latched by respective latch circuits 85, 86 are supplied to the gate of the output inverter of this final stage. When the output enable signal OE is H level, complementary data input signals N54, N55 are supplied through AND gate 89 and NAND gate 90, gates 83, 84 become conductive in response to the rising edge of the control clock CLK2, then the data input signals N54, N55 are latched by latch circuits 85, 86. Output-stage transistors 87, 88 are driven by these latched signals. Also, when the output enable signal OE is L level, the outputs of AND gate 89 and NAND gate 90 respectively become L level and H level, with the result that the output-stage transistors 87, 88 both assume an OFF condition, and output terminal Dout assumes an H impedance condition.

[Variable Delay Circuit]

Figure 13:
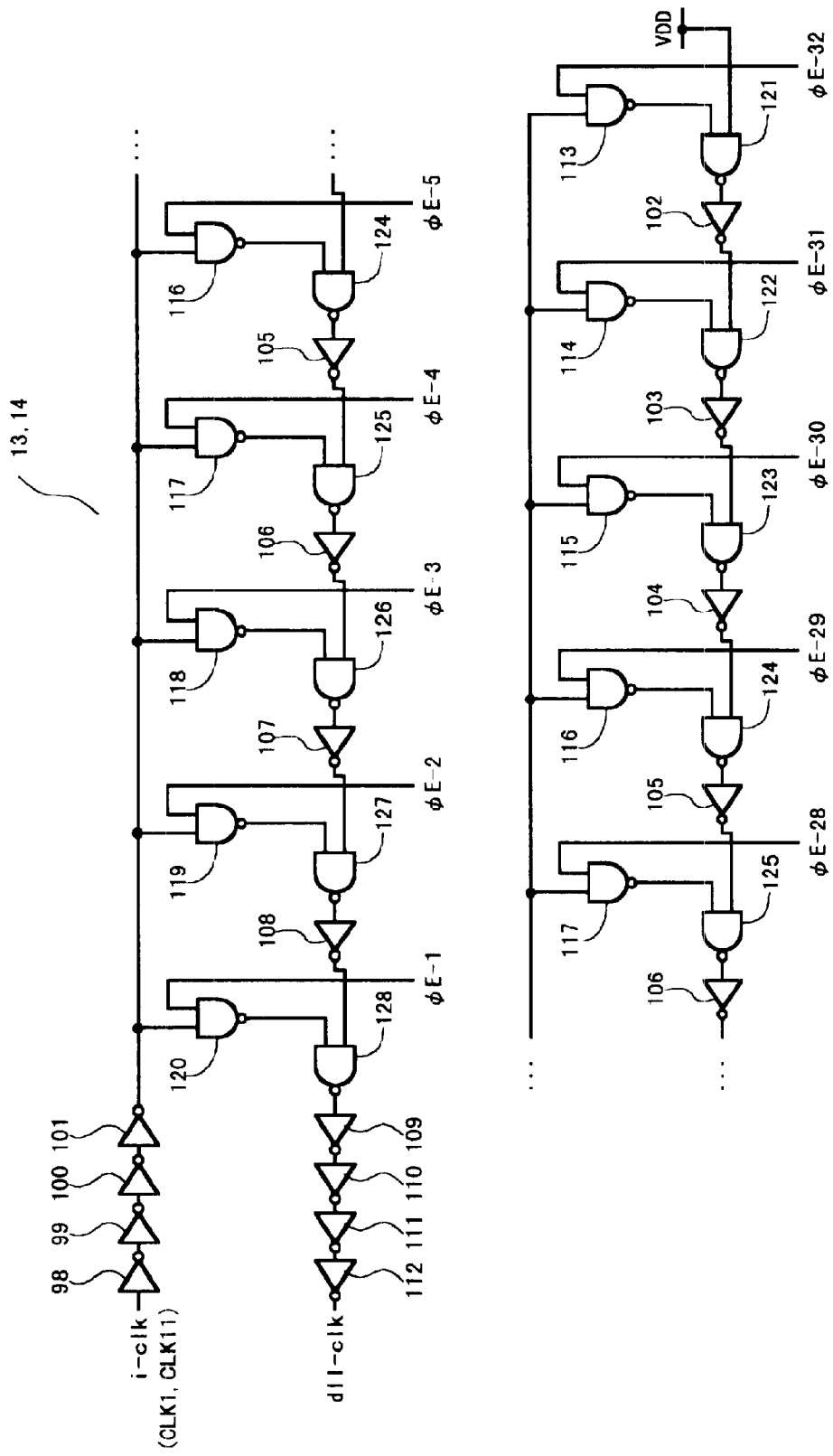
FIG. 13 is a view showing examples of variable delay circuits 13, 14.

FIG. 13 is a view showing an example of variable delay circuits 13, 14. These variable delay circuits delay the input clock i-clk and output an output clock dll-clk. The variable delay circuits 13, 14 are constructed as shown in the drawing by a plurality of inverters 99 to 112 and NAND gates 113 to 128. One input of NAND gates 113 to 120 is supplied with the clock obtained by delaying input clock i-clk, while the other input is supplied with a delay control signal $\phi_{E-1}$ to $\phi_{E-32}$. one of these delay control signals $\phi_{E-1}$ to $\phi_{E-32}$ is H level, while the rest of the delay control signals are all L level.

If we provisionally assume that delay control signal $\phi_{E-1}$ is H level, the outputs of NAND gates 113 to 119 all become H level, due to the other delay control signals being L level. As a result, all of the NAND gates 121 to 127 become L level, and inverters 102 to 108 all become H level. As a result, the input clock i-clk is output as the output clock dll-clk with the delay amount of the total of 10 gates, namely, the four inverters 99 to 101, NAND gates 120, 128, and the four inverters 109 to 112. This condition is the minimum condition of the delay amount.

Every time the H level delay control signal $\phi_{E-1}$ to $\phi_{E-32}$ is shifted to the right-hand side in the drawing, the delay amount of the two gates: NAND gate 127 and inverter 108 is added. And when the delay control signal $\phi_{E-32}$ becomes H level, the delay amount becomes a maximum. That is, every time the H level delay control signal of the delay control signals $\phi_{E-1}$ to $\phi_{E-32}$ is shifted by one to the right-hand side, the amount of delay is increased by an amount corresponding to two stages represented by an NAND gate and inverter, whereas every time it is shifted by one to the left-hand side, the amount of delay is likewise reduced by an amount corresponding to two stages.

[Phase Comparison Circuit]

Figure 14:
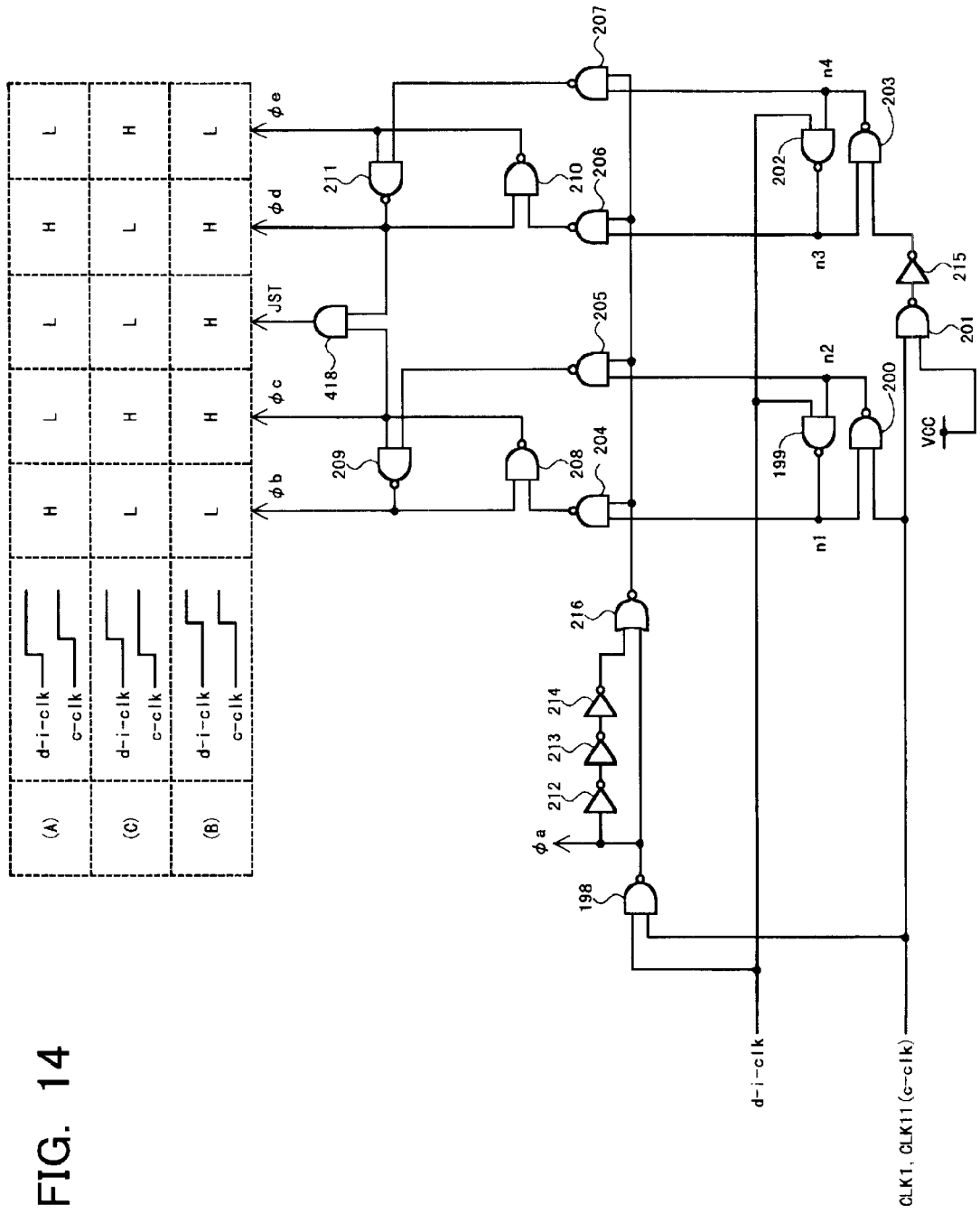
FIG. 14 is a circuit diagram of a phase comparison section within phase comparison circuit 16.
Figure 15A:
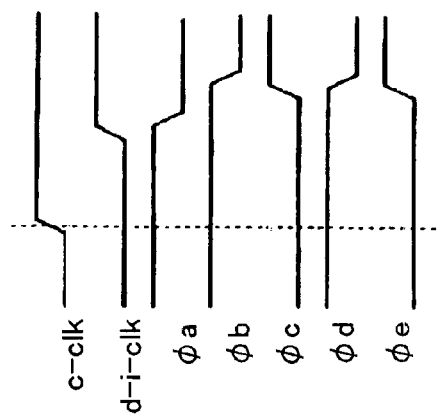
FIG. 15 is a waveform diagram showing the operation of the phase comparison section.

FIG. 14 is a circuit diagram of the phase comparison section within phase comparison circuit 16. Also, FIG. 15 is a waveform diagram illustrating the operation of the phase comparison section. In the portion constituted by NAND gates 199 to 203 and inverter 215, this phase comparison section detects the phase relationship between the first clock CLK1 or CLK11 (hereinbelow referred to representatively as c-clk) and the second clock d-i-clk, and generates the detection result at n1 to n4. The phase relationship of the two clocks may be classified into: a condition as shown in FIG. 15A in which the second clock d-i-clk is leading in phase with respect to the first clock c-clk, a condition as shown in FIG. 15B in which both clocks are substantially coincident in phase, and a condition as shown in FIG. 15C in which the phase of the second clock d-i-clk lags the phase of the first clock c-clk.

In the case of the condition of FIG. 15A, in the condition where both clocks are L level, all of the nodes n1 to n4 are H level, and thereafter the second clock d-i-clk becomes H level first, so that $n1=L, n2=H, n3=L,$ and $n4=H.$ Even if the first clock c-clk subsequently lags, becoming H level, the condition of nodes n1 to n4 does not change. The output of NAND gate 198 becomes L level when the two clocks both become H level, with the result that an H level pulse of prescribed width is output from NOR gate 216 from the falling edge thereof. This H level pulse is supplied as a sampling pulse to NAND gates 204 to 207, causing the condition of nodes n1 to n4 to be respectively input to the latch circuit comprising NAND gates 208, 209 and the latch circuit comprising NAND gates 210, 211. Consequently, signals $\phi b, \phi c, \phi d, \phi e$, as shown in the Table of FIG. 14, become:

$\phi b=H, \phi c=L, \phi d=H, \phi e=L.$

Figure 15B:
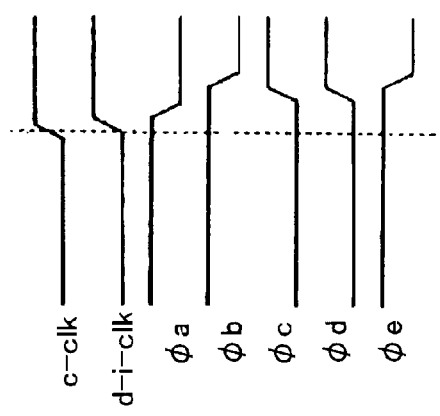
Figure 15C:
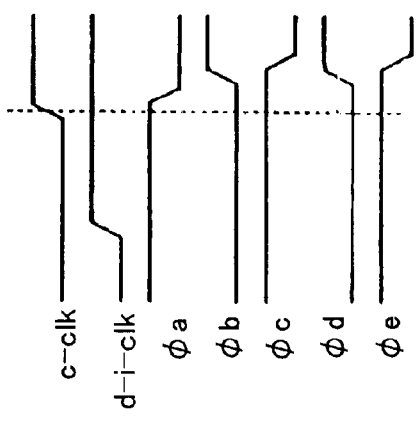

The condition of FIG. 15B is when the phase of the second clock d-i-clk lags the first clock c-clk by an amount within the range of the delay time of NAND gate 201 and inverter 215. In this case, the first clock c-clk becomes H level first, and $n1=H, n2=L.$ Further, after the second clock d-i-clk becomes H level, the output of inverter 215 becomes H level, with the result that $n3=L, n4=H.$ Consequently, the nodes n1 to n4 are latched with the timing at which the two colcks become H level, and signals $\phi b, \phi c, \phi d, \phi e$, as shown in the Table of FIG. 14, become:

$\phi b=L, \phi c=H, \phi d=H, \phi e=L.$

This means that their phases are in coincidence, is so the phase coincidence signal JST of the output of AND gate 418 also outputs H level.

In the condition of FIG. 15C, the first clock c-clk first becomes H level, and $n1=H, n2=L, n3=H,$ and $n4=L.$ After this, even though the second clock d-i-clk is delayed to become H level, there is no change in the condition of nodes n1 to n4. This condition is latched with the timing at which both clocks become H level, causing signals φb, φc, φd, φe to become $φb=L, φc=H, φd=L, φe=H$ as shown in the Table of FIG. 14.

Figure 16:
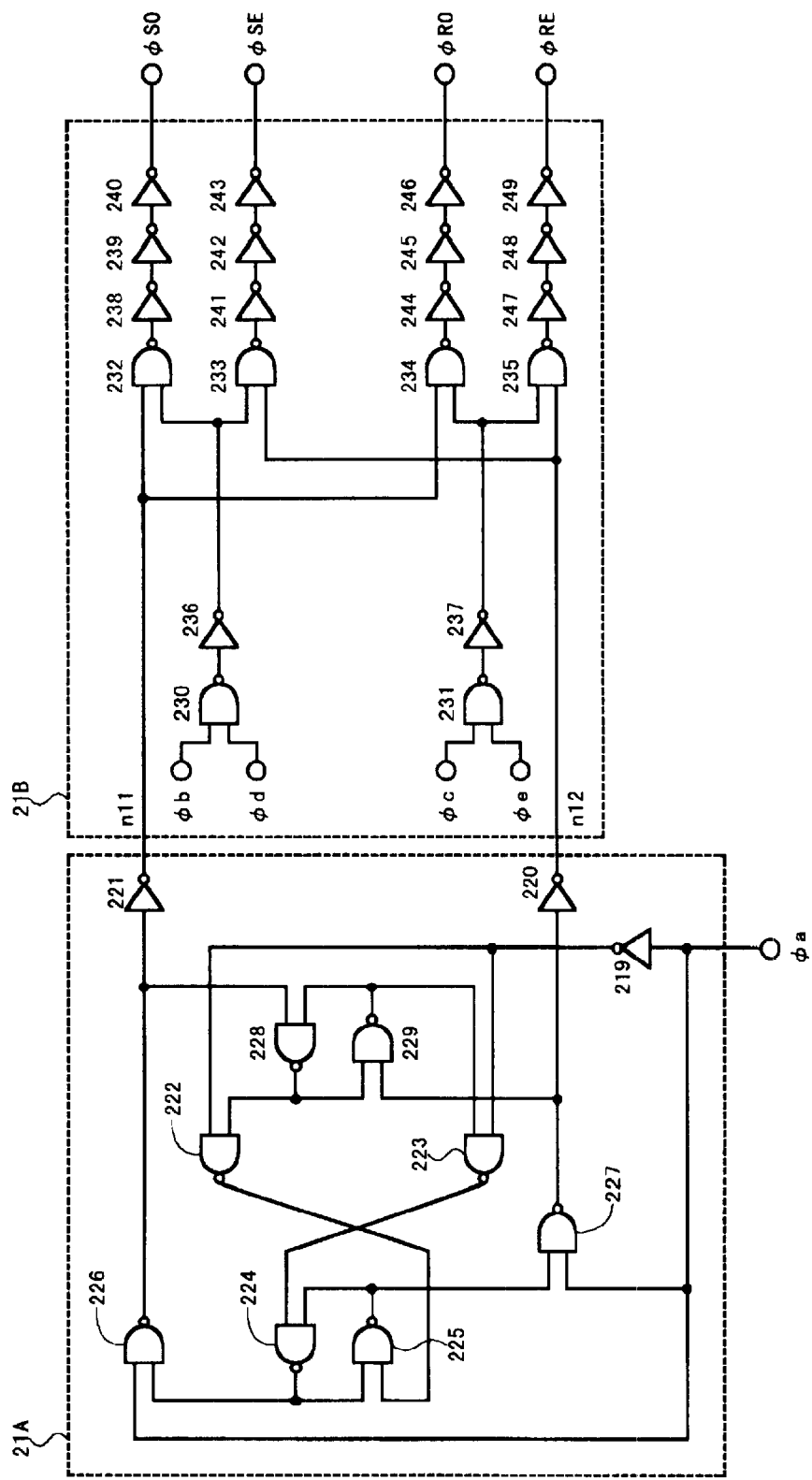
FIG. 16 is a circuit diagram of the phase comparison output section of phase comparison circuit 16.
Figure 17A:
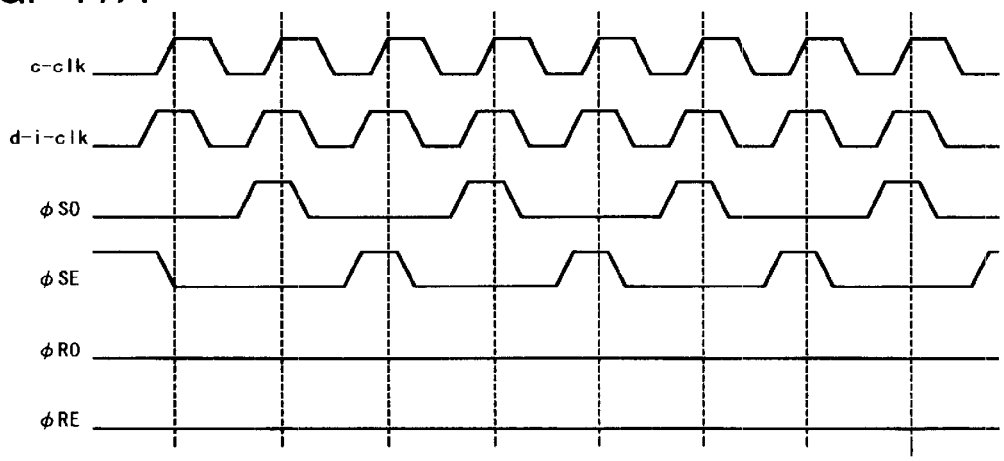
FIG. 17 is a waveform diagram showing the operation of the phase comparison output section.
Figure 17B:
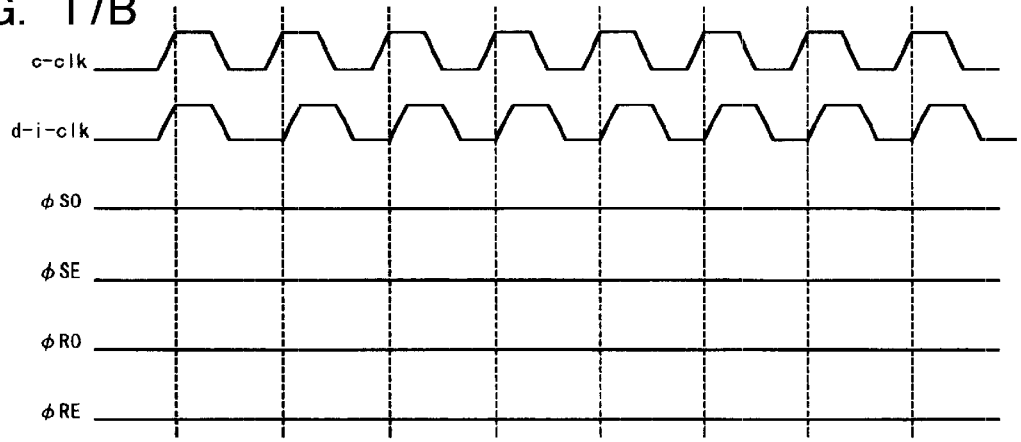
Figure 17C:
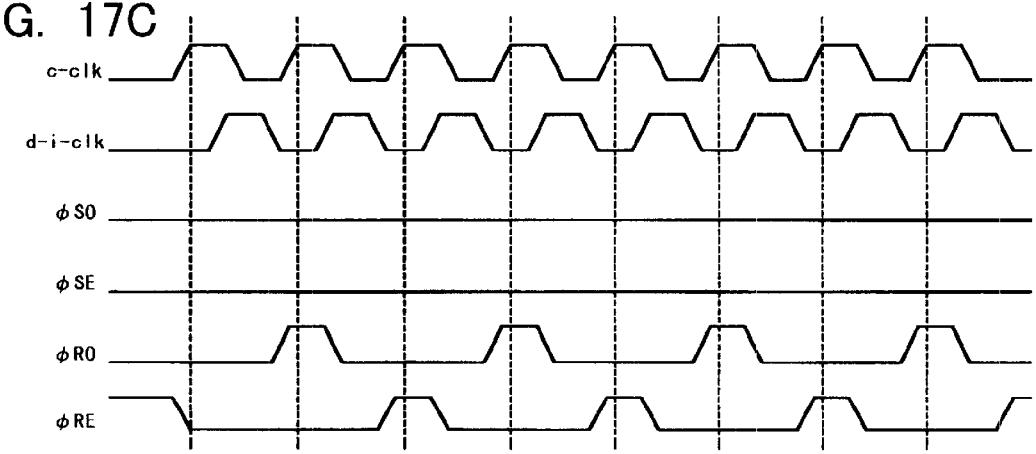

FIG. 16 is a circuit diagram of the phase comparison output section of phase comparison circuit 16. Also, FIG. 17 is a waveform diagram showing the operation of this phase comparison output section. FIGS. 17A, 17B, and 17C of the waveform diagram respectively correspond to (A), (B), and (C) of FIG. 14 and FIG. 15.

The phase comparison output section is constituted of a frequency division circuit 21A that divides to one half the frequency of the timing signal φa that is generated with the timing of phase comparison of the two clocks, and an output circuit 21B that outputs phase comparison result signals $φ_{SO}$ to $φ_{RE}$ based on signals φb, φc, φd, φe generated in accordance with the phase relationship of the two clocks in response to the timing of outputs n11, n12 from this frequency division circuit 21A.

The half-frequency division circuit 21A is constituted by a JK flip-flop; the time when the two clocks c-clk, d-i-clk both become H level is detected by NAND gate 198 (FIG. 14), this detection pulse φa is halved in frequency, and inverse-phase pulse signals n11 and n12 are generated. The detected pulse φa is applied to gates 226 and 227, and the inverted detected pulse /φa is supplied to gates 222, 223 so that inverted signals are transferred between a latch circuit comprising gates 228, 229 and a latch circuit comprising gates 224, 225. As a result, pulse signals n11, n12 of inverse phase that are halved in frequency are generated.

Output circuit 21B decodes the latch-sampled signals φb, φc, φd, φe: when the phase of the first clock c-clk (CLK1, CLKll) lags the second clock d-i-clk (condition (A)), it makes the output of diode 236 H level; when the phase of both clocks are the same (condition (B)), it makes the outputs of diodes 236 and 237 both L level; and when the phase of the first clock c-clk leads the second clock d-i-clk (condition (C)), it makes the output of diode 237 H level.

Consequently, by means of the decoding function of NAND gates 232 to 235, in the above condition (A), in response to the timing signals n11, n12, NAND gates 232, 233 of output circuit 21B make the phase comparison result signals $φ_{SO}, φ_{SE}$ that increase the amount of delay of variable delay circuit 13 alternately H level so as to delay the phase of the second clock d-i-clk. Specifically, this is as shown in FIG. 17A. Also, in the above condition (B), as shown in Figure and 17B, output circuit 21B generates no phase comparison result signals $φ_{SO}$ to $φ_{RE}$. Furthermore, in the case of the above condition (C), as shown in FIG. 17C, NAND gates 234, 235 make the phase comparison result signals $φ_{RO}$ to $φ_{RE}$ alternately H level so as to reduce the amount of delay of variable delay circuit 13 and so as to advance the phase of the second clock d-i-clk in response to timing signals n11, n12.

[Delay Control Circuit]

Figure 18:
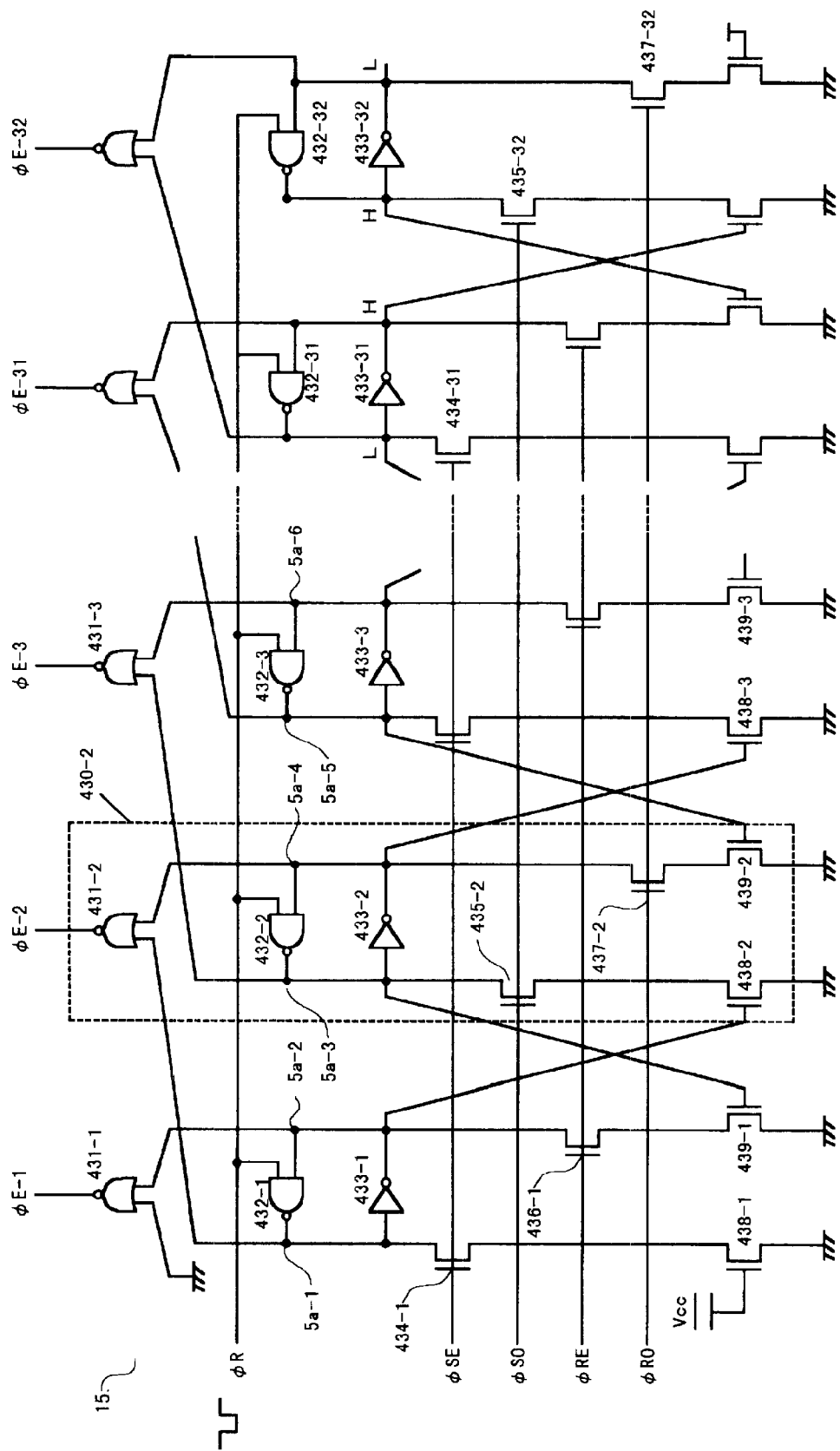
FIG. 18 is a circuit diagram of a delay control circuit.

FIG. 18 is a circuit diagram showing the construction of part of delay control circuit 15. Delay control circuit 15 outputs delay control signals $φ_{E-1}$ to $φ_{E-3}$ from NOR gates 431-1 to 431-3 in response to phase comparison result signals $φ_{SO}$ to $φ_{RE}$. As shown in FIG. 13, delay control signals $φ_{E-1}$ to $φ_{E-32}$ are 32-bit signals.

Delay control circuit 15, in response to phase comparison result signals $φ_{SO}, φ_{SE}$, shifts the H level delay control signal $φ_E$ to the right, increasing the amount of delay of the variable delay circuit and in response to phase comparison result signals $φ_{RO}, φ_{RE}$, shifts the H level delay control signal $φ_E$ to the left, decreasing the amount of delay of the variable delay circuit.

Each stage of the variable control circuit is respectively provided with a latch circuit consisting, for example in the case of the first stage, of NAND gate 432-1 and inverter 433-1. It is also provided with transistors 434-1, 436-1 that forcibly invert the condition of latch circuit 432-1 and 433-1 in response to the phase comparison result signals $φ_{SO}$ to $φ_{RE}$. Transistors 438-1, 439-1 are provided in order to ensure that latch circuits which are not intended to be inverted are not inverted by transistors 434-1, 436-1. The second- to third-stage circuits also have the same construction. Their transistors are all N-channel transistors.

If we now assume that an L level pulse reset signal $φ_R$ is applied, the outputs of NAND gates 431-1 to 3 all become H level, and the outputs of inverters 433-1 to 3 all become L level. Node 5a-2 therefore becomes L level and the delay control signal $φ_{E-1}$ of the output of NOR gate 431-1 becomes H level. Also, nodes 5a-1, 5a-3 are both H level, so the delay control signals $φ_{E-2}, φ_{E-3}$ other than $φ_{E-1}$ all become L level. Specifically, in response to the reset signal $φ_R$, the delay control signal $φ_{E-1}$ becomes H level, and the variable delay circuits 13, 14 are controlled to the minimum delay time.

Next, when phase comparison is executed, one or other of the phase comparison result signals $φ_{SO}$ to $φ_{RE}$ becomes H level, depending on the phase relationship of the two clocks. If we now assume that when phase comparison result signal $φ_{SE}$ becomes H level transistor 434-1 conducts, node 5a-1 is forcibly pulled down to L level, and node 5a-2 of the output of inverter 433-1 is forcibly pulled up to H level. As a result, the output $φ_{E-1}$ of NOR gate 431-1 becomes L level. Also, since nodes 5a-1 and 5a-4 are both L level, the output $φ_{E-2}$ of NOR gate 431-2 becomes H level. The first-stage and second-stage latch circuits then hold this condition. Furthermore, when the phase comparison result signal $φ_{SO}$ subsequently becomes H level as a result of subsequent phase comparison, by an identical action, nodes 5a-3 and 5a-6 both become L level, and the delay control signal $φ_{E-3}$ becomes H level. In this way, the phase control signal $φ_E$ is shifted to the right-hand side such that the delay time becomes longer, by the phase comparison result signals $φ_{SE}$ and $φ_{SO}$.

Contrariwise, the phase control signal $φ_E$ is shifted to the left-hand side such that the delay time becomes shorter by the phase comparison result signals $φ_{RE}$ and $φ_{RO}$ in an action opposite to that described above. As will be clear from the operation of the output section of the phase comparison circuit described above, the phase comparison result signals $φ_{SE}$ and $φ_{SO}$ are generated alternately on each phase comparison when the second clock d-i-clk is leading and the phase comparison result signals $φ_{RE}$ and $φ_{RO}$ are generated alternately on each phase comparison when the second clock d-i-clk is lagging.

Also, in response to the phase comparison result signals $φ_{SE}, φ_{SO}$, the delay control signal $φ_E$ successively shifts to the right hand side until finally the delay control signal $φ_{E-32}$ becomes H level. In this condition, the output of inverter 433-32 is latched at L level and the output of NAND gate 432-32 is latched at H level. When at this point a comparison result signal $\phi_{SO}$ is supplied which further extends the delay time, the output of NAND gate 432-32 is pulled down to L level, and the output of inverter 433-32 is pulled up to H level.

As described above, with the present invention, in a DLL circuit for timing control incorporated in a memory device or the like, phase adjustment that determines an output timing is performed in accordance to an external load that is connected to an output terminal. Consequently, the DLL circuit of the present invention can generate a control clock of optimum timing matching a device conditions in which the device is mounted in a system.

Also, in the phase adjustment operation, since the operating delay time of the data output buffer is measured by utilizing a single changeover of data, the time required for adjustment of the device can be made short. Thus, a control clock with optimum timing can be generated by utilizing a variable delay circuit having a delay amount adjusted in this way in the feedback loop of the DLL circuit.

Furthermore, according to the present invention, even during ordinary operation, the operating delay time of the data output buffer is measured by utilizing the change of data output during ordinary operation, so departure of the phase relationship from the optimum condition due to an unanticipated cause during operation can be prevented.

What is claimed is:

1. A delayed lock loop (DLL) circuit, connected to an output buffer, that generates a control clock having a prescribed phase relationship with a reference clock by delaying the reference clock, in which the output buffer supplies an output signal to an output terminal in response to the control clock, said DLL circuit comprises:

a first variable delay circuit that receives said reference clock and outputs the control clock and a first delayed clock delayed from the reference clock by a controlled delay time;

a second variable delay circuit that receives the first delayed clock of said first variable delay circuit and outputs a second delayed clock delayed from the first delayed clock by a prescribed delay time;

a phase comparison/delay control circuit that compares the phase of said reference clock and said second delayed clock and controls the amount of delay of said first variable delay circuit such that the phase of said reference clock and of the second delayed clock are in a prescribed relationship; and a delay measurement circuit that measures an operating delay time of said output buffer and sets the delay amount of said second variable delay circuit in accordance with the measured operating delay time.

2. The DLL circuit of claim 1 wherein said reference clock is supplied through an input buffer and said delay measurement circuit measures a total delay period of the operating delay time of said output buffer and a delay time of a dummy input buffer having a delay time which is equivalent to a delay time of said input buffer, and sets the delay amount of said second variable delay circuit to be equivalent to said total delay time.

3. The DLL circuit of claim 1, wherein said delay measurement circuit measures a period from a timing of said control clock to a timing of said output signal of said output buffer.

4. The DLL circuit of claim 2 or 3 wherein said delay measurement circuit operates when changeover of said output signal so as to measure a period from a timing of said control clock until changeover of said output signal.

5. The DLL circuit of claim 2 or 3 wherein said delay measurement circuit measures said period in the initialization condition on power source start-up.

6. The DLL circuit of claim 2 or 3 wherein said delay measurement circuit measures said period with a periodic timing in an ordinary condition of a device including the DLL circuit.

7. The DLL circuit of claim 5 further comprising a dummy data generating circuit that generates dummy data and wherein, in said initialization condition, said dummy data is supplied to said output buffer.

8. The DLL circuit of claim 1 wherein the first delayed clock of said first variable delay circuit is the same as said control clock.

9. The DLL circuit of claim 1, wherein said first variable delay circuit comprises a third variable delay circuit that is supplied with said reference clock, said third variable delay circuit being controlled to a delay amount which is the same as said first variable delay circuit, and the output clock of said third variable delay circuit being supplied to said output buffer as said control clock.

* * * * *